(12) United States Patent
Hanyu

(10) Patent No.: US 6,547,494 B2
(45) Date of Patent: Apr. 15, 2003

(54) DIAMOND COATED TOOL AND METHOD OF MANUFACTURING THE DIAMOND COATED TOOL

(75) Inventor: Hiroyuki Hanyu, Toyokawa (JP)

(73) Assignee: OSG Corporation, Toyokawa (JP)

( * ) Notice: Subject to any disclaimer, the term of this patent is extended or adjusted under 35 U.S.C. 154(b) by 0 days.

(21) Appl. No.: 09/879,969

(22) Filed: Jun. 14, 2001

(65) Prior Publication Data

US 2002/0001717 A1 Jan. 3, 2002

(30) Foreign Application Priority Data

Oct. 19, 2000 (JP) .................................... 2000-318758
May 28, 2002 (JP) .................................... 2000-195892

(51) Int. Cl.[7] .......................... B23B 27/14; B26D 1/12
(52) U.S. Cl. ................................ 407/53; 407/119
(58) Field of Search ..................... 407/53, 118, 119, 407/62, 63, 56

(56) References Cited

U.S. PATENT DOCUMENTS 5,217,332 A * 6/1993 Takasaki et al. ............ 408/144
5,607,264 A * 3/1997 Konig et al. ................. 407/118
5,653,300 A * 8/1997 Lund et al. .................. 175/428
5,660,936 A * 8/1997 Williams ..................... 407/119
5,667,344 A * 9/1997 Simpson et al. ............. 407/118
6,007,276 A * 12/1999 Wardell ......................... 407/54
6,042,886 A * 3/2000 Matthee et al. .............. 407/119
6,110,240 A * 8/2000 Saguchi et al. .............. 205/674

FOREIGN PATENT DOCUMENTS

| JP | 5-263251 A | 10/1993 |
| JP | 6-951 B2 | 1/1994 |
| JP | 2519037 B2 | 5/1996 |

* cited by examiner

Primary Examiner—Kien T. Nguyen
(74) Attorney, Agent, or Firm—Oliff & Berridge, PLC

(57) ABSTRACT

A diamond-coated tool including: (a) a substrate; and (b) a diamond coating disposed on the substrate. The diamond coating is formed of diamond crystals grown on the substrate. Each of the diamond crystals has a diameter not larger than 2 μm as measured on an outer surface of the diamond coating, and/or a length not larger than 2 μm as measured in a direction in which each of the grown diamond crystals has expanded by its growth. The diamond coating preferably consists of a plurality of layers.

16 Claims, 8 Drawing Sheets

Example 1

Comparative Example 1

Comparative Example 2

Comparative Example 3

PRIOR ART

DIAMOND COATED TOOL AND METHOD OF MANUFACTURING THE DIAMOND COATED TOOL

BACKGROUND OF THE INVENTION

1. Field of the Invention

The present invention relates in general to a diamond-coated tool, and more particularly to such a diamond-coated tool which is capable of machining a workpiece with high degrees of surface smoothness and profile accuracy, and also to a method of manufacturing the same.

2. Discussion of the Related Art

As one type of a cutting tool such as an end mill, a drill, a tap and a disposable or throwaway insert, there is proposed a diamond-coated tool in which a tool substrate is coated with a diamond coating, as disclosed in JP-B2-2519037 (publication of Japanese Patent issued in 1996) by way of example. In the tool disclosed in this Japanese Patent publication, the tool substrate is coated with the diamond coating in accordance with CVD (chemical vapor deposition) method.

The diamond coating of the disclosed tool consists of an aggregation of diamond crystals, each of which has grown or expanded from a nucleus disposed on the surface of the tool substrate so as to have a large columnar shape, so that each diamond crystal has a grain size or diameter as large as 5–10 $\mu$m as measured on or adjacent to an outer surface of the diamond coating, i.e., as measured on a plane perpendicular to a direction in which the diamond crystal has grown or expanded. The large diameter of each diamond crystal causes the outer surface of the diamond coating to have large pits and projections and a high degree of surface roughness (e.g. a large value in the maximum height Ry). The large pits and projection on the diamond coating surface are inevitably transferred onto a machined surface of a workpiece which is machined by the cutting tool, thereby making it difficult to obtain a required degree of smoothness on the machined surface.

It is considered possible to somewhat smooth the diamond coating surface, for example, by grinding a portion of the diamond coating which portion covers the cutting edge, by attaining uniform crystal orientation of the diamond crystals, or by reducing the size of each crystal, namely, forming the diamond crystals in the form of crystallites. However, the grinding operation leads to an increase in a manufacturing cost of the tool, and provides a possibility that the diamond coating is damaged by a shock applied to the tool during the grinding operation, thereby possibly deteriorating a durability of the coating. The uniformity of the crystal orientation in (100) causes a large compressive stress to remain in the coating, thereby possibly causing easy removal of the coating from the substrate of the tool. Further, where the surface of the substrate is roughened to have pits and projections serving to increase an adhesion strength with which the diamond coating adheres to the substrate, the pits and projections, i.e., irregularities on the roughened surface of the substrate are not offset by the diamond crystallites, whereby the pits and projections formed on the substrate surface undesirably remain more or less on the coating surface, resulting in an unsatisfactory degree of smoothness of the coating surface. The cutting edge of the tool is rounded or chamfered in the roughening operation, whereby the cutting sharpness or performance of the tool is deteriorated. The deterioration of the cutting sharpness or performance also constitutes a factor causing the deterioration of the machined surface of the workpiece.

The above-described drawbacks or problems are encountered not only where the diamond-coated tool takes the form of a cutting tool but also where the diamond-coated tool takes the form of other machining tool such as a cold-forming tool which is designed to form the workpiece into a desired shape by plastically deforming the workpiece.

SUMMARY OF THE INVENTION

It is therefore a first object of the present invention to provide a diamond-coated tool which is capable of machining a workpiece with high degrees of surface smoothness and profile accuracy. This first object may be achieved according to any one of first, second, third, fourth and fifth aspects of this invention which are described below.

It is a second object of the present invention to provide a method of manufacturing a diamond-coated tool which is capable of machining a workpiece high degrees of surface smoothness and profile accuracy. This second object may be achieved according to any one of sixth, seventh, eighth, ninth and tenth aspects of this invention which are described below.

The first aspect of the invention provides a diamond-coated tool comprising: a substrate; and a diamond coating disposed on the substrate, the diamond coating being formed of diamond crystals grown on the substrate, each of the diamond crystals having a diameter not larger than 2 $\mu$m as measured on an outer surface of the diamond coating.

The term "diameter of each diamond crystal or each diamond crystallite" used in this specification is interpreted to mean the largest dimension of each diamond crystal or crystallite as measured in a direction substantially perpendicular to a direction in which the diamond crystal or crystallite has expanded or grown, namely, as measured in a direction substantially parallel to the surface of the substrate and the outer surface of the diamond coating. It is preferable that each of all the diamond crystals or crystallites which are exposed on the outer surface of the diamond coating has a diameter not larger than 2 $\mu$m. It is noted that the diameters of the diamond crystals or crystallites can be measured, for example, by using an electron microscope of about 1000–10000 magnification.

According to the second aspect of the invention, in the diamond-coated tool defined in the first aspect of the invention, the diameter of each of the diamond crystals is not larger than 2 $\mu$m as measured on any one of cross sections perpendicular to a direction in which each of the diamond crystals has expanded by growth thereof. It is preferable that each of all the diamond crystals which are exposed on the outer surface of the diamond coating has a diameter not larger than 2 $\mu$m as measured on any one of the cross sections perpendicular to the direction in which the diamond crystal has expanded in the growth.

According to the third aspect of the invention, in the diamond-coated tool defined in the first or second aspect of the invention, the grown diamond crystals consist of grown diamond crystallite, and the diamond coating consists of a plurality of layers.

The diamond-coated tool defined in any one of the first, second and third aspects of the invention provides a surface of a workpiece machined by the tool, with a high degree of surface smoothness, owing to reduced pits and projections, i.e., reduced irregularities on the outer surface of the diamond coating which is constituted by the diamond crystals each having the diameter not larger than 2 $\mu$m as measured on the outer surface of the diamond coating. The diamond-coated tool defined in the third aspect of the invention has an additional advantage that the diameter of each diamond crystal can be easily reduced owing to the multilayer diamond coating consisting of the plurality of layers superposed on each other. It is noted that the term "crystallites" used in this specification is interpreted to mean ones of the crystals each of which has the maximum diameter and length (the largest dimension as measured in the direction substantially perpendicular to the expanding direction of the diamond crystal and the largest dimension as measured in the expanding direction of the diamond crystal) not larger than about 3 $\mu$m.

The fourth aspect of the invention provides a diamond-coated tool comprising: a substrate; and a diamond coating consisting of a plurality of layers and disposed on the substrate, the diamond coating being formed of diamond crystals grown on the substrate, each of the diamond crystals having a length not larger than 2 $\mu$m as measured in a direction in which each of the diamond crystals has expanded by growth thereof. It is preferable that each of all the diamond crystals or crystallites which are exposed on the outer surface of the diamond coating has a length not larger than 2 $\mu$m as measured in the direction in which the diamond crystal or crystallite has expanded in the growth. The lengths of the diamond crystals or crystallites can be measured, for example, by using an electron microscope of about 1000–10000 magnification.

The diamond-coated tool of this fourth aspect of the invention also provides a surface of a workpiece machined by the tool, with a high degree of surface smoothness, owing to reduced pits and projections in the outer surface of the multilayer diamond coating which is constituted by the diamond crystals each having the length not larger than 2 $\mu$m as measured in the expanding direction of the diamond crystal, i.e., in a direction substantially perpendicular to the surface of the substrate.

The fifth aspect of the invention provides a diamond-coated tool comprising: a substrate having a surface roughened to have a predetermined degree of surface roughness; and a diamond coating consisting of a plurality of layers and disposed on the roughened surface of the substrate, the diamond coating being formed of diamond crystals grown on the substrate, each of the diamond crystals having a diameter not larger than 2 $\mu$m as measured on an outer surface of the diamond coating, the diamond coating having a maximum thickness of not larger than 14 $\mu$m; wherein the roughened surface has a roughness curve whose maximum height Ry is not larger than 1 $\mu$m and whose ten-point height of irregularities Rz is 0.2–0.5 $\mu$m; and wherein the substrate has a rake face, a flank face and a cutting edge which is defined by an intersection of the rake face and the flank face, the cutting edge being rounded as a result of roughening of the surface of the substrate such that the cutting edge is displaced in an inward direction of the substrate by a distance not larger than 5 $\mu$m.

The distance, by which the cutting edge is displaced as a result of the rounding or chamfering of the cutting edge, is represented, for example, by the reference sign "d" in FIG. 3 that is a cross sectional view of a diamond-coated tool constructed according to an embodiment of the invention. In FIG. 3, the reference numerals 19', 19 denote the cutting edge before and after the rounding of the cutting edge, respectively.

In the diamond-coated tool of this fifth aspect of the invention, the displacement amount of the cutting edge as a result of the rounding of the cutting edge is not larger than 5 $\mu$m, and the maximum thickness of the diamond coating is not larger than 14 $\mu$m. Since the rounding amount of each cutting edge and the thickness of the diamond coating are thus minimized, the tool has an excellent cutting sharpness even after the substrate of the tool has been coated with the diamond coating. Further, the roughened surface of the substrate, which has the roughness curve whose maximum height Ry is not larger than 1 $\mu$m and whose ten-point height of irregularities Rz is 0.2–0.5 $\mu$m, has a required degree of surface smoothness, while providing a required degree of adhesion strength with which the diamond coating adheres to the substrate. The multilayer diamond coating is formed of the diamond crystals each having the diameter not larger than 2 $\mu$m as measured on the outer surface of the diamond coating, so that the outer surface of the diamond coating has a sufficiently high degree of surface smoothness which cooperates with the above-described excellent cutting sharpness for improving the surface smoothness of the machined surface of the workpiece.

The sixth aspect of the invention provides a method of manufacturing a diamond-coated tool which includes a substrate having a surface, and a diamond coating disposed on the surface of the substrate, the method comprising: a nucleus bonding step of bonding nucleuses to the substrate which is disposed in a reactor of a chemical vapor deposition device; and a crystal growing step of growing diamond crystals in the reactor in accordance with a chemical vapor deposition method, such that the diamond crystals expand from the nucleuses, wherein the nucleus bonding step and the crystal growing step are repeatedly implemented for thereby forming, on the surface of the substrate, the diamond coating consisting of a plurality of layers.

According to the seventh aspect of the invention, in the method defined in the sixth aspect of the invention, the diamond crystals are grown for a predetermined time in the crystal growing step, the predetermined time being determined such that each of the diamond crystals grows to have a diameter not larger than 2 $\mu$m as measured on any one of cross sections perpendicular to a direction in which each of the diamond crystals expands by growth of the diamond crystals.

According to the eight aspect of the invention, in the method defined in the sixth or seventh aspect of the invention, the diamond crystals are grown for a predetermined time in the crystal growing step, the predetermined time being determined such that each of the diamond crystals grows to have a length not larger than 2 $\mu$m as measured in a direction in which each of the diamond crystals expands by growth of the diamond crystals.

The method defined in the sixth or seventh aspect of the invention is advantageously used for manufacturing the diamond-coated tool defined in any one of the first, second and third aspects of the invention, and provides the substantially same technical advantages as the first, second and third aspects of the invention. The method defined in the eighth aspect of the invention, in which the growths of the diamond crystals are suspended at the predetermined time that has been determined such that each diamond crystal grows to have the length not larger than 2 $\mu$m, is advantageously used for manufacturing the diamond-coated tools defined in the fourth aspect of the invention, and provides the substantially same technical advantages as the fourth aspect of the invention. In the method defined in any one of the six, seventh and eighth aspects of the invention, the nucleus bonding step and the crystal growing step are repeatedly implemented in the reactor of the chemical vapor deposition device, for forming the diamond coating consisting of the plurality of layers. Thus, the method of this fourth aspect of the invention makes it possible to simultaneously manufacture a large number of diamond-coated tools in each of which the sizes of the diamond crystals are accurately controlled with high precision.

The ninth aspect of the invention provides a method of manufacturing a diamond-coated tool which includes a substrate having a surface, and a diamond coating disposed on the surface of the substrate, the substrate having a rake face, a flank face and a cutting edge that is defined by the an intersection of the rake face and the flank face, the method comprising; a surface roughening step of roughening the surface of the substrate of the tool, such that the roughened surface has a roughness curve whose maximum height Ry is not larger than 1 μm and whose ten-point height of irregularities Rz is 0.2–0.5 μm, and such that the cutting edge is chamfered or rounded to be displaced in an inward direction of the substrate by a distance not larger than 5 μm; and a coating forming step of forming the diamond coating on the roughened surface of the substrate, by growing diamond crystals in accordance with a chemical vapor deposition method, such that each of the diamond crystals has a diameter not larger than 2 μm as measured on an outer surface of the diamond coating, and such that the diamond coating consists of a plurality of layers and has a maximum thickness not larger than 14 μm.

According to the tenth aspect of the invention, in the method defined in the ninth aspect of the invention, the coating forming step includes: a nucleus bonding step of bonding nucleuses to the substrate which is disposed in a reactor of a chemical vapor deposition device; and a crystal growing step of growing diamond crystals for a predetermined time in the reactor in accordance with a chemical vapor deposition method, such that the diamond crystals grow from the nucleuses, wherein the predetermined time is determined such that each of the diamond crystals grows to have a diameter not larger than 2 μm, and wherein the nucleus bonding step and the crystal growing step are repeatedly implemented for thereby forming, on the surface of the substrate, the diamond coating consisting of the plurality of layers.

The method defined in the ninth or tenth aspect of the invention is advantageously used for manufacturing the diamond-coated tool defined in the fifth aspect of the invention, and provides the substantially same technical advantages as the fifth aspect of the invention. In the method defined in the tenth aspect of the invention, the nucleus bonding step and the crystal growing step are repeatedly implemented in the reactor of the chemical vapor deposition device, for forming the diamond coating consisting of the plurality of layers. Thus, the method of the tenth aspect of the invention makes it possible to simultaneously manufacture a large number of diamond-coated tools in each of which the sizes of the diamond crystals are accurately controlled with high precision.

The principle of the present invention is advantageously applicable to a rotary or non-rotary cutting tool such as an end mil, a drill, a tap, a threading die and a replaceable insert which is used to cut, principally, an aluminum casting, an aluminum alloy, a copper, a copper alloy or other non-ferrous metal, and to a method of manufacturing such a cutting tool. However, the principle of the invention is also applicable to a cutting tool which is used to cut a material other than the non-ferrous metal, and even to a non-cutting tool such as a cold-forming tool which is designed to form the workpiece into a desired shape by plastically deforming the workpiece. The substrate of the diamond-coated tool of the invention is preferably made of a cemented carbide, but may be made of a cermet, a ceramic or other material.

While each diamond crystal has the diameter not larger than 2 μm as measured on the outer surface of the diamond coating or as measured on any cross sections perpendicular to the expanding direction of the diamond crystal in the first, second, third, fifth and seventh aspects of the invention, it is more preferable that the diameter of each diamond crystal is not larger than 1 μm in these aspects of the invention. While each diamond crystal has the length not larger than 2 μm as measured in the expanding direction of the diamond crystal in the fourth and eighth aspects of the invention, it is more preferable that the length of each diamond crystal is not larger than 1 μm in these aspects of the invention.

While each diamond crystal has the length not larger than 2 μm in the fourth and eighth aspects of the invention, each diamond crystal in the first, second and third and seventh aspects of the invention may have a length larger than 2 μm as measured in the expanding direction of the diamond crystal as long as the diameter of the diamond crystal is not larger than 2 μm. Where the diamond coating consists of the plurality of layers and is formed of the crystal diamonds whose growths are suspended such that the length of each diamond crystal as measured in its expanding direction is not larger than 2 μm as in the fourth and eighth aspects of the invention, in general, it is possible to prevent the diameter of each diamond crystal from exceeding 2 μm, whereby the pits and projections on the outer surface of the diamond coating can be advantageously reduced. In this respect, the fourth and eighth aspects of the invention may be considered embodied forms of the first, second and third and seventh aspects of the invention. It is also to be understood that the diameter of each diamond crystal in the fourth and eighth aspects of the invention may be larger than 2 μm.

The fifth and ninth aspects of the invention, in which the diameter of each diamond crystal as measured on the outer surface of the diamond coating is not larger than 2 μm, may be considered embodied forms of the first, second and third and seventh aspects of the invention. It is noted that the fifth and ninth aspects of the invention may be modified to include the feature that the length of each diamond crystal as measured in its expanding direction is not larger than 2 μm, in place of or in addition to the feature that the diameter of each diamond crystal as measured on the outer surface of the diamond coating is not larger than 2 μm, as the fourth or eighth aspect of the invention. The modifications provide the same technical advantages as the fifth and ninth aspects of the invention.

In the fifth, ninth and tenth aspects of the invention, the substrate of the tool is subjected to the roughening treatment or step so that the surface of the substrate is roughened for increasing an adhesion strength with which the diamond coating adheres to the substrate. In the other aspects of the invention, however, the substrate surface does not have to be necessarily roughened. For example, it is possible to increase the adhesion strength by providing an interface layer between the substrate and the diamond coating in the other aspects of the invention. That is, in the first, second, third, fourth, sixth, seventh and eighth aspects of the inventions, the diamond coating may be disposed directly on the surface of the substrate, or may be disposed on the interface layer disposed on the surface of the substrate so that the interface layer is interposed between the substrate and the diamond coating. The interface layer may be formed of carbide, nitride or oxide of a metal groups IVa–VIa in the periodic table, or alternatively of aluminum nitride, as disclosed in JP-A-5-263251 (publication of unexamined Japanese Patent Application laid open in 1993) and JP-B2-

6-951 (publication of examined Japanese Patent Application laid open for opposition purpose in 1994). The provision of the interface layer has an advantage that it is possible to reliably improve the surface smoothness of the machined workpiece, simply by reducing irregularities such as pits and projections in the outer surface of the diamond coating, irrespective of the surface roughness of the substrate which is covered by the interface layer.

While the thickness of the diamond coating is not larger than 14 µm in the fifth, ninth and tenth aspects of the invention, the thickness of the diamond coating in the other aspects of the invention may be larger than 14 µm.

In the roughening treatment or surface roughening step in the fifth or ninth aspect of the invention, the surface of the substrate is preferably sandblasted or etched in a chemical manner so as to be roughened to have the predetermined degree of surface roughness. If the displacement amount of the cutting edge as a result of the rounding or chamfering of the cutting edge is larger than 5 µm, the cutting sharpness of the tool is deteriorated. The displacement amount of the cutting edge should be accordingly equal to or smaller than 5 µm, preferably, as small as possible, although the optimum displacement amount of the cutting edge varies depending upon the thickness of the diamond coating. The roughened surface should have the maximum height Ry not larger than 1 µm, and the ten-point height of irregularities Rz held in the range of 0.2–0.5 µm. If the maximum height Ry is larger than 1 µm, or if the ten-point height of irregularities is larger than 0.5 µm, the smoothness in the outer surface of the diamond coating is deteriorated due to the large irregularities in the roughed surface of the substrate, resulting in an unsatisfactory degree of smoothness of the surface of the machined workpiece. If the ten-point height of irregularities is smaller than 0.2 µm, on the other hand, it is difficult to reliably obtain a sufficiently high degree of adhesion strength with which the diamond coating adheres to the substrate.

The diamond coating is formed in accordance with, preferably, a microwave plasma CVD method or a hot filament CVD method. However, the formation of the diamond coating may be made in the other CVD methods such as a high-frequency plasma CVD method.

BRIEF DESCRIPTION OF THE DRAWINGS

The above and other objects, features, advantages and technical and industrial significance of this invention will be better understood by reading the following detailed description of the presently preferred embodiments of the invention, when considered in connection with the accompanying drawings, in which.

DETAILED DESCRIPTION OF THE PREFERRED EMBODIMENT

Figure 1:
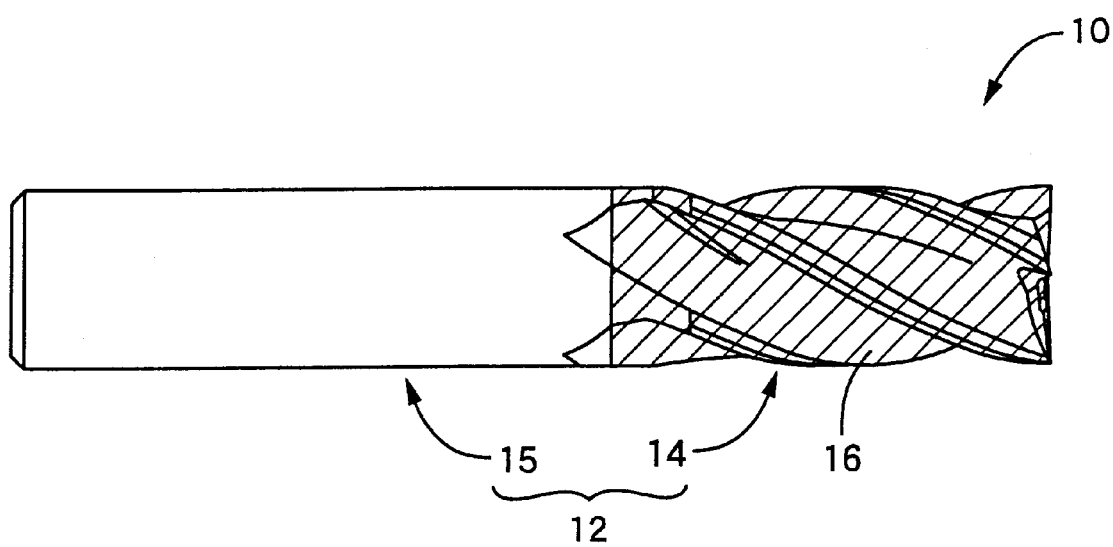
FIG. 1 is an elevational view of a diamond-coated tool in the form of an end mill which is constructed according to an embodiment of the invention.

FIG. 1 shows a diamond-coated tool in the form of an end mill 10 which is constructed according to this invention. The end mill 10 includes a tool substrate (base material) 12 made of a cemented carbide. The tool substrate 12 has a cutting tooth portion 14 and a shank portion 15 which are formed integrally with each other. The cutting tooth portion 14, in which flutes and cutting teeth 18 are formed, has a surface that is coated with a diamond coating 16. In FIG. 1, the oblique-lined portion represents a portion of the surface on which the diamond coating 16 is coated. Each of the cutting teeth 18 has a rake face and flank faces so that a peripheral cutting edge and a bottom cutting edge are formed in the cutting tooth 18. The peripheral cutting edge is defined by an intersection of the rake face and one of the flank faces, while the bottom cutting edge is defined by an intersection of the rake face and the other of the flank faces.

Figure 2:
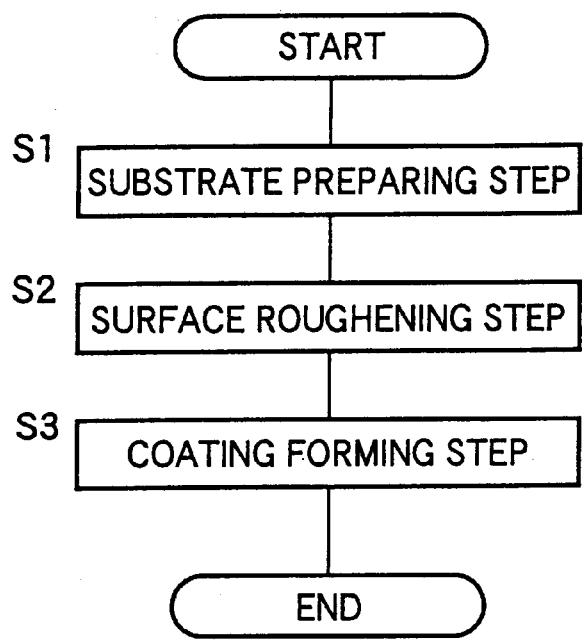
FIG. 2 is a flow chart illustrating a procedure for manufacturing the end mill of FIG. 1.
Figure 3:
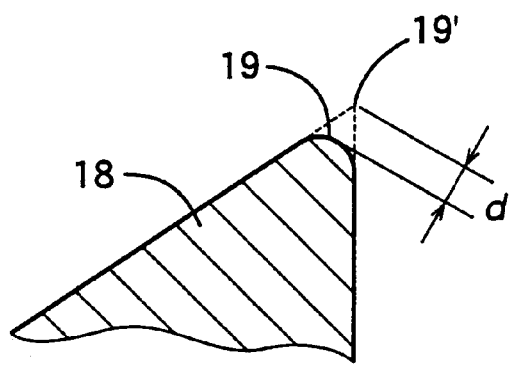
FIG. 3 is a cross sectional view of a cutting tooth portion of the end mill of FIG. 1, showing a cutting edge of the end mill which is rounded in a surface roughening step S2 of the manufacturing procedure of FIG. 2.

FIG. 2 is a flow chart illustrating a procedure for manufacturing the end mill 10 of FIG. 1. The manufacturing procedure is initiated with a substrate preparing step S1 in which a cemented carbide bar is subjected to a grinding operation and/or other machining operation for forming the tool substrate 12. A surface roughening step S2 is then implemented to roughen the surface of the cutting tooth portion 14 of the tool substrate 12, for increasing an adhesion strength with which the diamond coating 16 adheres to the cutting tooth portion 14. In this surface roughening step S2, the surface of the cutting tooth portion 14 is etched in a chemical manner such that the roughened surface has a roughness curve whose maximum height Ry is not larger than 1 µm and whose ten-point height of irregularities Rz is held in a range of 0.2–0.5 µm and such that each of the cutting edges is rounded or chamfered to be displaced in an inward direction of the tool substrate 12 by a distance d not larger than 5 µm. FIG. 3 is a cross sectional view of the cutting tooth portion 14, and shows one of the peripheral and bottom cutting edges of each cutting tooth 18 which one is rounded or chamfered in the surface roughening step S2. In FIG. 3, the reference numeral 19' denotes the cutting edge before the implementation of the surface roughening step S2, while the reference numeral 19 denotes the cutting edge after the implementation of the surface roughening step S2. As is clear from FIG. 3, a distal end portion of each cutting tooth 18, which portion is defined by the broken lines, is removed whereby the cutting edge is inwardly displaced by the distance d.

Figure 4:
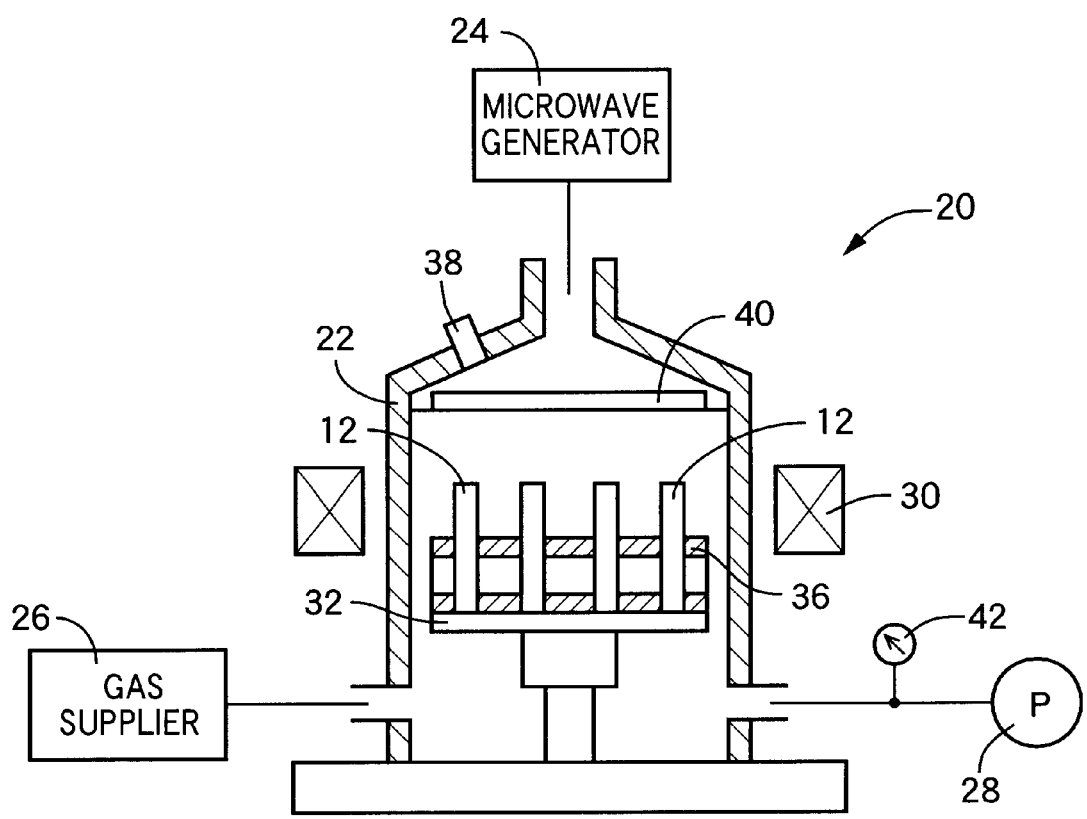
FIG. 4 is a view schematically showing, by way of example, a microwave plasma CVD device which is used in a coating forming step S3 of the manufacturing procedure of FIG. 2.

The surface roughening step S2 is followed by a coating forming step S3 in which the roughened surface of the cutting tooth portion 14 of the tool substrate 12 is coated with the diamond coating 16 by using a microwave plasma CVD device 20 as shown in FIG. 4. The diamond coating 16 thus disposed on the roughened surface of the cutting tooth portion 14 consists of a plurality of layers formed of diamond crystal or crystallites. Each of the diamond crystal has a diameter of not larger than 1 $\mu$m. The diamond coating 16 has a maximum thickness not larger than 14 $\mu$m and an average thickness not smaller than 10 $\mu$m.

The microwave plasma CVD device 20 used in the coating forming step S3 includes a tubular furnace or reactor 22, a microwave generator 24, a gas supplier 26, a vacuum pump 28 and an electromagnetic coil 30, as shown in FIG. 4. The device 20 further includes a table 32 which is disposed in the tubular reactor 22, and a supporting member 36 which is disposed on the table 32. A plurality of tool substrates 12 are supported by the supporting member 36 such that the cutting tooth portion 14 of each tool substrate 12 which is to be coated with the diamond coating 16 is positioned upwardly of the shank portion 15.

The microwave generator 24 serves to generate, for example, a microwave having a frequency of about 2.45 GHz. Each tool substrate 12 is heated with introduction of the microwave into the reactor 22, and a temperature at the surface of the cutting tooth portion 14 of the heated substrate 12 is detected by a radiation thermometer 38 which is provided in the reactor 22. An electric power supplied to the microwave generator 24 is controlled in a feedback manner, i.e., on the basis of a signal representative of the detected temperature, such that the detected temperature coincides with a predetermined temperature. A silica glass window 40 is provided in an upper portion of the reactor 22, for introducing the generated microwave into the reactor 22.

The gas supplier 26 serves to supply a material gas such as methane ($CH_4$), hydrogen ($H_2$) and carbon monoxide (CO) into the reactor 22. The gas suppliers 26 includes a gas cylinder which is filled with the material gas, a flow control valve which serves to control a flow rate of the material gas, and a flowmeter which serves to measure the flow rate of the material gas. The vacuum pump 28 serves to reduce the pressure in the interior of the reactor 22, by sucking the gas in the interior of the reactor 22. An electric current supplied to the a motor of the vacuum pump 28 is controlled in a feedback manner such that an actual value of the pressure detected by a pressure gage 42 coincides with a predetermined value. The electromagnetic coil 30 consists of an annular mass which is positioned radially outwardly of the tubular reactor 22 so as to surround the outer circumferential surface of the reactor 22.

Figure 5:
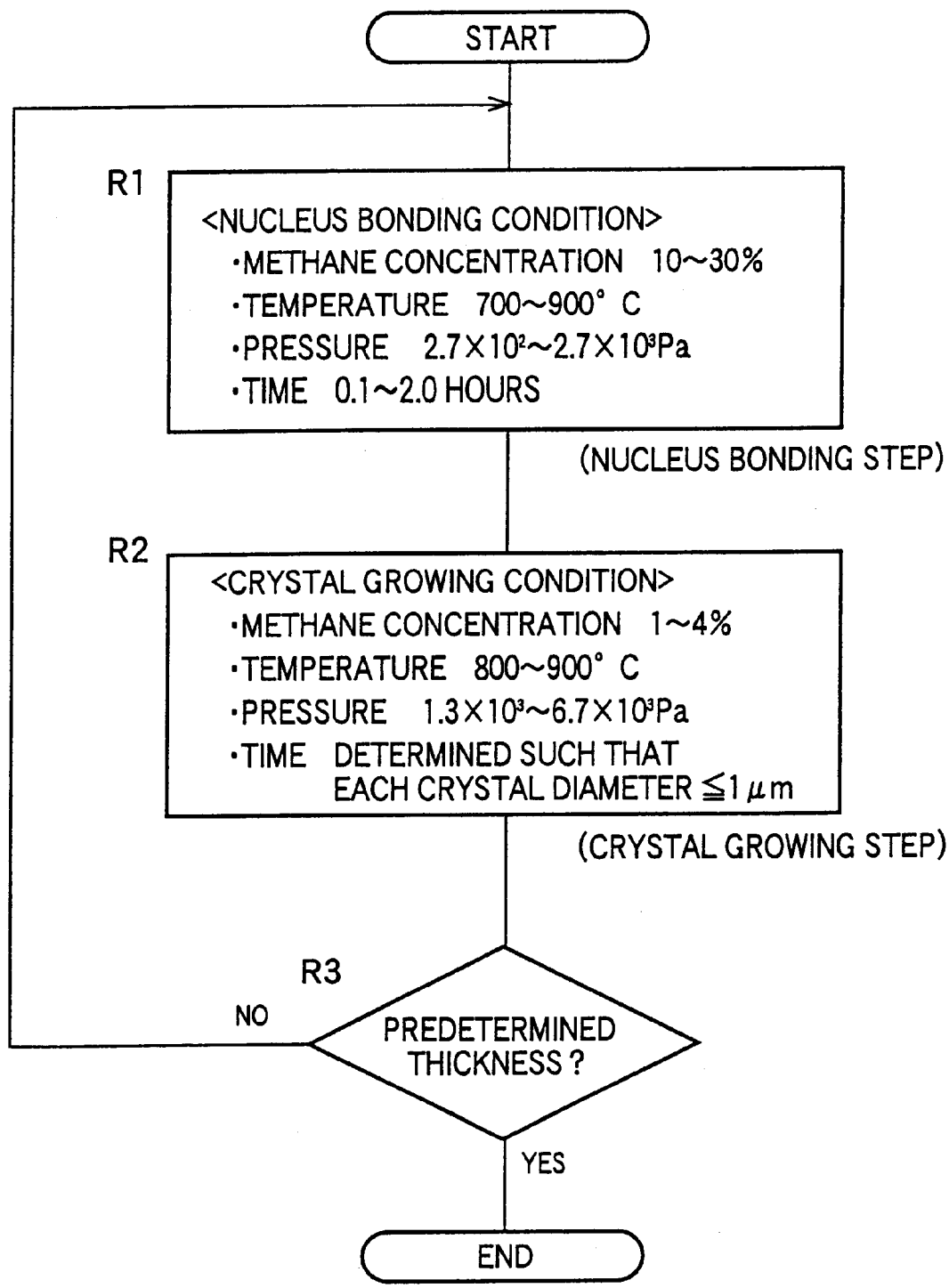
FIG. 5 is a flow chart illustrating the details of the coating forming step S3 of the manufacturing procedure of FIG. 2.

FIG. 5 is a flow chart illustrating the coating forming step S3 implemented by either manual or automatic operation of the microwave plasma CVD device 20. That is, operations to turn on and off, set-up and control the device 20 may be manually performed by the operator, or alternatively performed automatically according to a predetermined control program by a control device such as a microcomputer. The coating forming step S3 includes a nucleus bonding step R1, a crystal growing step R2 and a thickness checking step R3, which are implemented repeatedly as needed, as shown in FIG. 5.

The nucleus bonding step R1 is implemented to bond a nucleus layer to the tool substrate 12, so that diamond crystals can expand or grow from the nucleus layer in the crystal growing step R2. In the nucleus bonding step R1, the concentration of the methane in the supplied gas, the temperature of the tool substrate 12 and the pressure in the reactor 22 are adjusted to predetermined values. More specifically, the flow rates of the methane and hydrogen are controlled such that the concentration of the methane in the supplied gas coincides with a predetermined value which may range from 10% to 30%. The microwave generator 24 is controlled such that the temperature at the surface of the tool substrate 12 coincides with a predetermined value which may range from 700° C. to 900° C. The vacuum pump 28 is activated such that the pressure in the reactor 22 coincides with a predetermined value which may range from $2.7 \times 10^2$ Pa to $2.7 \times 10^3$ Pa. The concentration of the methane, the temperature of the tool substrate 12 and the pressure in the reactor 22 are held in the respective predetermined values for 0.1–2.0 hours. It is noted that the term "nucleus layer" used in this specification may be interpreted to mean a layer consisting of an aggregation of a multiplicity of nucleuses.

The nucleus bonding step R1 is followed by the crystal growing step R2 in which the diamond crystals are grown from the nucleus layer such that each of the grown diamond crystals has a diameter of not larger than 1 $\mu$m. That is, the diamond crystals are grown for a predetermined time, and the growths of the diamond crystals are then stopped at the predetermined point of time. In the crystal growing step R2, the flow rates of the methane and hydrogen are controlled such that the concentration of the methane in the supplied gas coincides with a predetermined value which may range from 1% to 4%. The microwave generator 24 is controlled such that the temperature at the surface of the tool substrate 12 coincides with a predetermined value which may range from 800° C. to 900° C. The vacuum pump 28 is activated such that the pressure in the reactor 22 coincides with a predetermined value which may range from $1.3 \times 10^3$ Pa to $6.7 \times 10^3$ Pa. The concentration of the methane, the temperature of the tool substrate 12 and the pressure in the reactor 22 are held in the respective predetermined values for the predetermined time which is predetermined such that the diameter of each diamond crystal exceeds the predetermined threshold, i.e., 1 $\mu$m. This predetermined time is shorter than a time that makes each diamond crystal have a length of 1 $\mu$m as measured in a growing direction in which the diamond crystal expands or grows. This time is calculated or obtained prior to the determination of the predetermined time. That is, in the present method of the growth of the diamond crystals, the diameter as measured on a plane perpendicular to the growing direction is held equal to or smaller than 1 $\mu$m, as long as the length of the diamond crystal as measured in the growing direction is not larger than 1 $\mu$m.

The crystal growing step R2 is followed by the thickness checking step R3 which is implemented to check if an actual thickness of the diamond coating 16 formed on the tool substrate 12 as a result of the growths of the diamond crystals has amounted to a predetermined thickness or not, for example, by counting how many times the crystal growing step R2 has been implemented. The nucleus bonding step R1 and the crystal growing step R2 are repeatedly implemented until an affirmative decision (YES) is obtained in the thickness checking step R3. Namely, a negative decision (NO) obtained in the thickness checking step R3 is followed by the new implementations of the nucleus bonding step R1 and the crystal growing step R2. Where the length of the diamond crystal is increased by 1 μm in each implementation of the crystal growing step S2 until the actual thickness of the diamond coating 16 amounts to 12 μm, for example, the affirmative decision is obtained in the thickness checking step R3 when the crystal growing step R2 has been implemented twelve times. In this case, the formed diamond coating 16 consists of twelve layers superposed on each other.

In the first implementation of the nucleus bonding step R1, the nucleus layer is boned directly to the surface of the cutting tooth portion 14 of the tool substrate 12. In the second and following implementations of the nucleus bonding step R1, the nucleus layer is bonded to the surface of the layer consisting of the diamond crystals which have been grown in the last implementation of the crystal growing step R2. Namely, in the second and following implementations of the nucleus boding step R1, the nucleus layer is formed on the diamond crystals whose growths have been suspended. In the implementation of the crystal growing step R2 following the second and following implementations of the nucleus boding step R1, new diamond crystals are grown from the newly formed nucleus layer without re-growths of the diamond crystals which have been grown in the last implementation of the crystal growing step R2 and which are located under the newly formed nucleus layer. The tool substrate 12 is coated at its surface with the multilayer diamond coating 16 which consists of the plurality of layers formed of diamond crystal or crystallites each having the diameter and length both of which are equal to or smaller than 1 μm. It is noted that the first implementation of the nucleus boding step R1 does not have to be necessarily made in the reactor 22 of the microwave plasma CVD device 20, but may be carried out outside the reactor 22.

In the end mill 10 manufactured as described above, the distance d, by which each cutting edge of the cutting teeth 18 was displaced as a result of the rounding or chamfering of the cutting edge in the surface roughening step S2, is not larger than 5 μm, and the maximum thickness of the diamond coating 16 formed in the coating forming step S3 is not larger than 14 μm. Since the rounding or chamfering amount of each cutting edge and the thickness of the diamond coating 16 are thus minimized, the end mill 10 has an excellent cutting sharpness even after the cutting tooth portion 14 of the tool substrate 12 has been coated with the diamond coating 16. Further, the roughened surface of the tool substrate 12, which has the roughness curve whose maximum height Ry is not larger than 1 μm and whose ten-point height of irregularities Rz is 0.2–5 μm, has a required degree of surface smoothness, while providing a required degree of adhesion strength with which the diamond coating 16 adheres to the tool substrate 12. The diamond coating 16 consists of the plurality of layers formed of the diamond crystals or crystallites each having the diameter and length both of which are equal to or smaller than 1 μm, so that the outer surface of the diamond coating 16 has a sufficiently high degree of surface smoothness which cooperates with the above-described excellent cutting sharpness for further improving the surface smoothness of the machined surface of the workpiece.

In the present embodiment, the nucleus bonding step R1 and the crystal growing step R2 are repeatedly implemented in the reactor 22 of the microwave plasma CVD device 20, for forming the diamond coating 16 consisting of the plurality of layers formed of the diamond crystals or crystallites each having the above-described size, thereby making it possible to simultaneously manufacture a large number of end mills 10 in each of which the sizes of the diamond crystals or crystallites are accurately controlled with high precision.

For confirming the technical advantages provided by the invention, a test was conducted by using four end mills each having two cutting teeth and a diameter of 10 mm. The four end mills were: (a) Example 1 in the form of a diamond-coated end mill constructed according to the present invention; (b) Comparative Example 1 in the form of a non-coated end mill in which the tool substrate is not coated with a coating; (c) Comparative Example 2 in the form of a conventional diamond-coated tool; and (d) Comparative Example 3 in the form of a conventional diamond-coated tool. Described more specifically, Example 1 was prepared in accordance with the procedure illustrated by the flow chart of FIG. 2 such that the surface of the tool substrate was roughened in the surface roughening step S2 to have the maximum height Ry of 1 μm and the ten-point height of irregularities Rz of 0.2–0.5 μm. Comparative Example 1 was prepared without the implementations of the steps S2 and S3 of FIG. 2, and has the tool substrate whose surface has the maximum height Ry smaller than 0.5 μm and the ten-point height of irregularities Rz smaller than 0.2 μm. Comparative Example 2 was prepared by roughening the tool substrate prepared in the substrate preparing step S1 of FIG. 2 such that the roughened surface of the tool has the maximum height Ry of 3 μm and the ten-point height of irregularities Rz of 1–2 μm as in a conventional manner, and then forming the diamond coating on the thus roughened surface of the tool substrate in the coating forming step S3 of FIG. 2. Comparative Example 3 was prepared in the same procedure as Comparative Example 2 except that the tool substrate was coated with a conventional monolayer diamond coating consisting of a single layer, in place of the multilayer diamond coating consisting of the plurality of layers formed in the coating forming step S3 of FIG. 2.

Figure 6A:
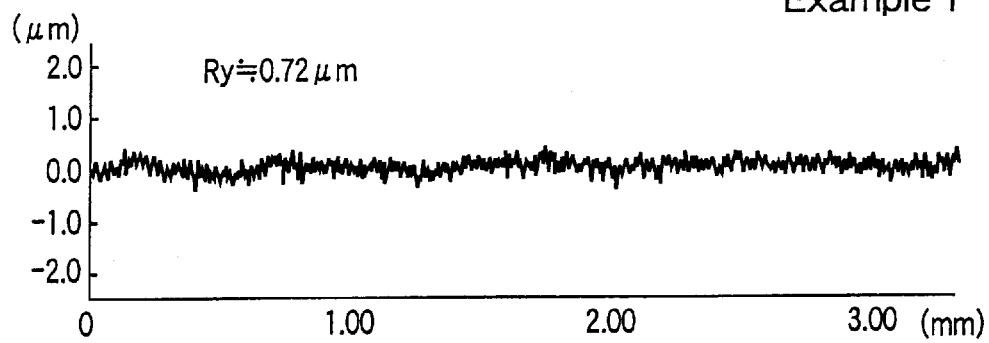
FIG. 6A is a graph indicating a surface roughness of a workpiece which was cut by Example 1 in the form of a diamond-coated end mill constructed according to the present invention.
Figure 6B:
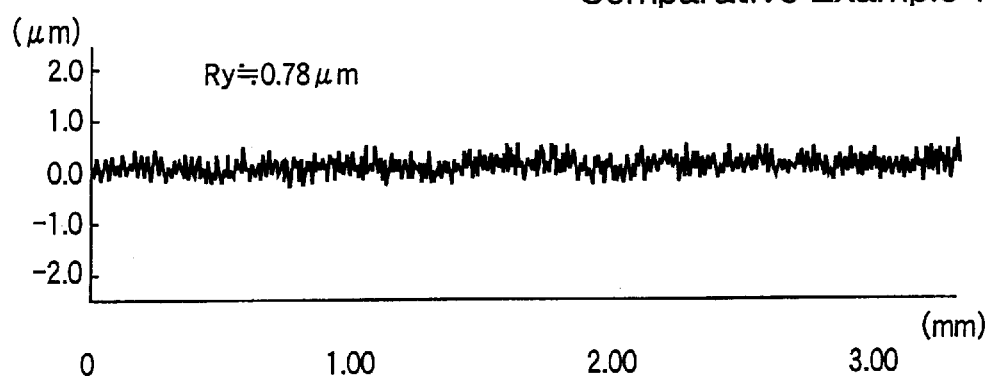
FIG. 6B is a graph indicating a surface roughness of a workpiece which was cut by Comparative Example 1 in the form of a non-coated end mill.
Figure 6C:
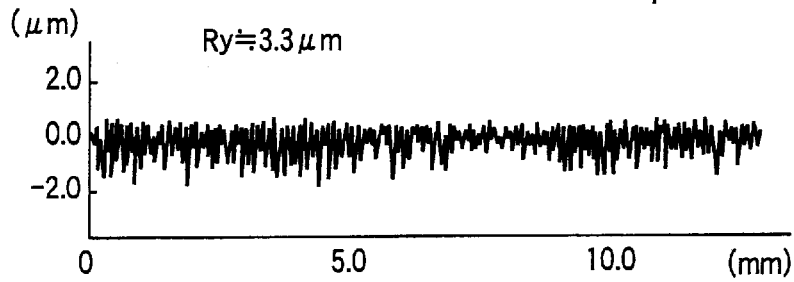
FIG. 6C is a graph indicating a surface roughness of a workpiece which was cut by Comparative Example 2 in the form of a conventional diamond-coated tool.
Figure 6D:
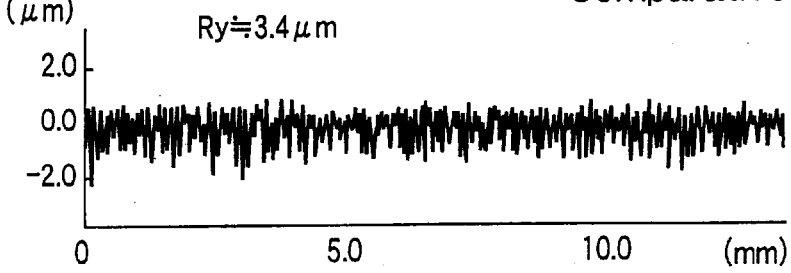
FIG. 6D is a graph indicating a surface roughness of a workpiece which was cut by Comparative Example 3 in the form of a conventional diamond-coated tool.

In the test, the surface roughness of the workpiece machined or cut by each of the above-described four end mills under a cutting condition as specified below.
[Cutting Condition]
  Workpiece: A7075 (Aluminum)
  Cutting velocity: 400 mm/min
  Feed rate: 0.05 mm/tooth
  Depth of cut:
    AD (Axial depth)=20 mm
    RD (Radial depth)=0.1 mm
Cutting Fluid: Water Soluble Cutting Fluid The result of the test is show in FIGS. 6A–6D. FIG. 6A indicates the surface roughness of the workpiece cut by Example 1 which is the diamond-coated end mill of the present invention. FIG. 6B indicates that of the workpiece cut by Comparative Example 1 which is the non-coated end mill. FIG. 6C indicates that of the workpiece cut by Comparative Example 2 which is the conventional diamond coated end mill. FIG. 6D indicates that of the workpiece cut by Comparative Example 3 which is the conventional diamond coated end mill. As is apparent from FIGS. 6A–6D, Example 1 provides the workpiece with a remarkably higher degree of surface smoothness than Comparative Examples 2 and 3. Further, the degree of the surface smoothness of the workpiece cut by Example 1 is substantially equal to or higher than that of the workpiece cut by Comparative Example 1, in spite of the tool substrate of Example 1 which is coated with the diamond coating.

Another test was conducted by using Comparative Example 4 in the form of a diamond-coated end mill, in addition to the above-described Example 1 and Comparative Example 2. Comparative Example 4 was prepared without the implementation of the surface roughening step S2 so that the diamond coating was applied onto the substrate surface which was not subjected to a roughening treatment. In this test, the adhesion strength with which the diamond coating adheres to the tool substrate in each of these Examples was evaluated under a condition as described below.

[Condition]

The outer surface of the diamond coating of each Example was irradiated with SiC grit (#800) in accordance with a micro-blasting method, with an irradiation pressure of 0.6 MPa and an irradiation distance of 5 mm. Under this condition, an irradiation time required for removable of the diamond coating from the tool substrate was measured. It is noted that the thickness of the diamond coating of each Example was 12 $\mu$m.

According to the result of the test, the diamond coating of Example 1 and Comparative Example 2 was removed from the tool substrate with the irradiation time of 10–15 minutes, while the diamond coating of Comparative Example 4 was removed from the tool substrate with the radiation time of 10–20 seconds. This result revealed that Comparative Example 4 had a lower degree of adhesion strength than Example 1 and Comparative Example 2, and that Example 1 had the substantially same degree of adhesion strength as Comparative Example 2 in which the surface of the tool substrate was roughened in a conventional manner, namely, the surface was roughened to have a higher degree of surface roughness than in Example 1.

Figure 7A:
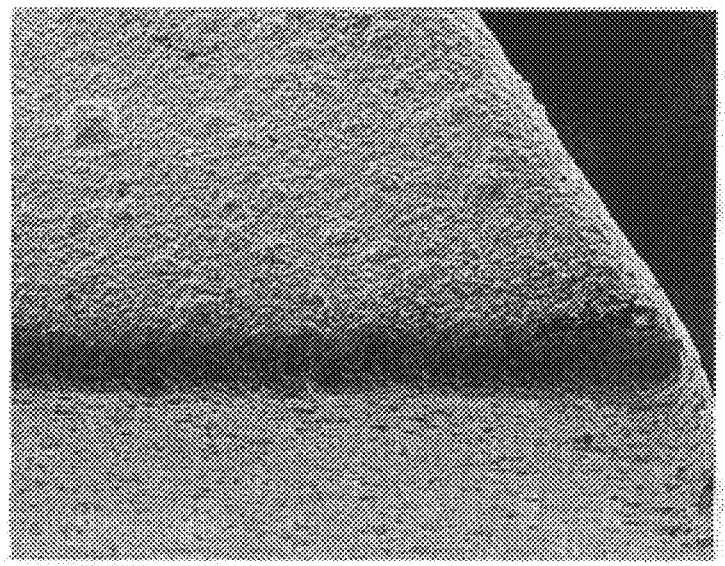
FIGS. 7A and 7B are microphotographs showing cutting teeth of the diamond-coated end mills of Example 1 and Comparative Example 5, respectively, and taken by an electron microscope after each of these end mills were used to cut a workpiece over a predetermined distance.
Figure 7:
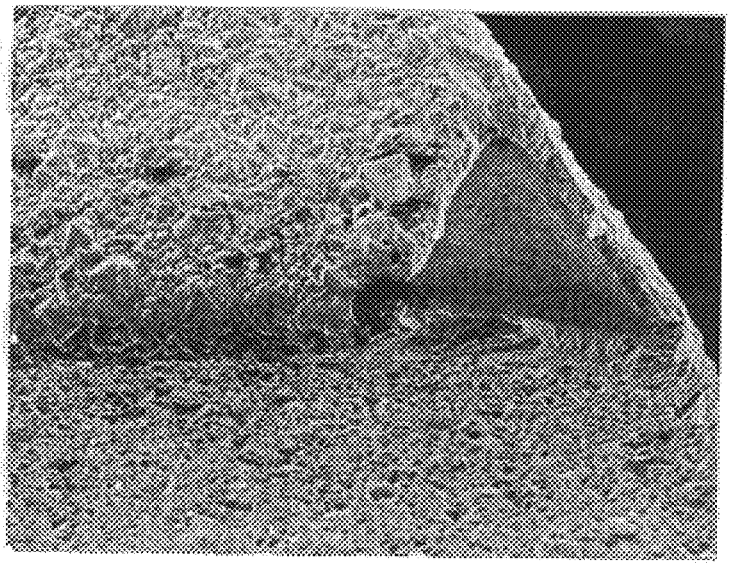

Still another test was conducted by using, in addition to the above-described Example 1, Comparative Example 5 in the form of a conventional diamond-coated end mill in which the tool substrate was coated with the monolayer diamond coating consisting of a single layer. Comparative Example 5 was prepared in accordance with a procedure which was substantially identical with the procedure illustrated by the flow charts of FIGS. 2 and 5, except that each of the nucleus bonding step R1 and the crystal growing step R2 was implemented only once in the diamond forming step S3. FIGS. 7A and 7B are microphotographs showing the cutting teeth of Example 1 and Comparative Example 5, respectively, and taken by an electron microscope after each of these Examples was used to cut a workpiece over an accumulative distance of 1108 m, under a cutting condition as specified below. It is appreciated from the microphotographs that the monolayer diamond coating consisting the single layer is partially removed from the tool substrate as shown in FIG. 7B while the multilayer diamond coating consisting of the plurality of layers is not removed at all from the tool substrate as shown in FIG. 7A. Thus, the test revealed that Example 1 constructed according to the invention had an excellent degree of durability or adhesion strength.

[Cutting Condition]

Figure 8A:
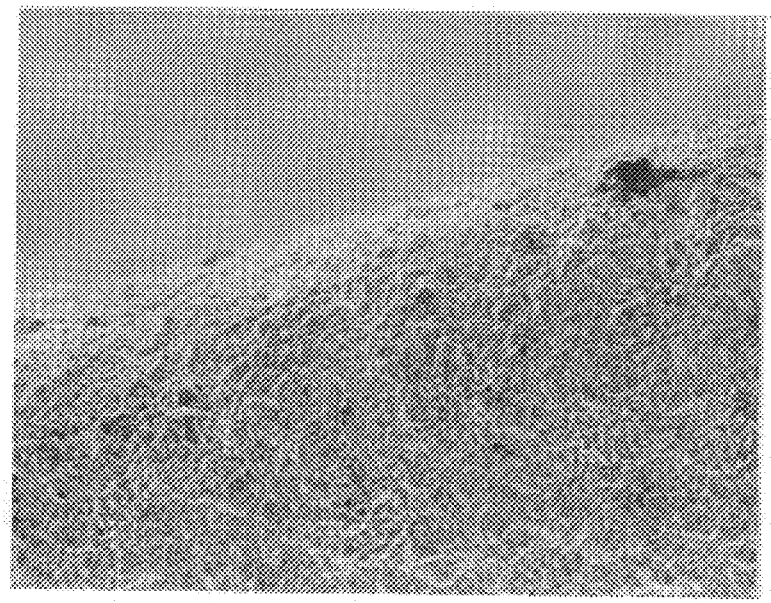
FIGS. 8A and 8B are microphotographs showing a surface of a multilayer diamond coating and a surface of a monolayer diamond coating, respectively, and taken by an electron microscope.
Figure 8B:
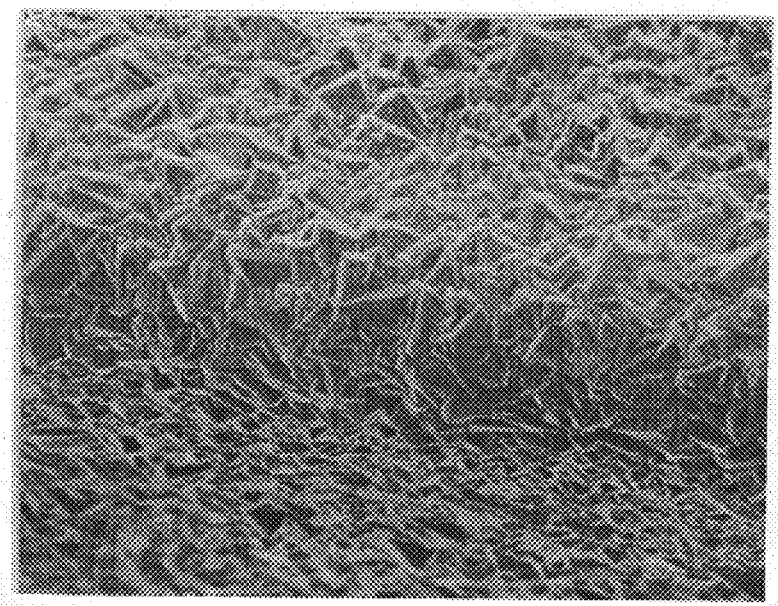

Workpiece: ADC12 (Aluminum alloy die-casting)
Number of revolutions: 1280 min$^{-1}$ (revolutions per minute)
Feed rate: 0.05 mm/tooth
Depth of cut:
  AD (Axial depth)=10 mm
  RD (Radial depth)=0.1 mm FIGS. 8A and 8B are microphotographs taken by an electron microscope with a magnification of 1000 and showing surfaces of respective diamond coatings. The diamond coating of the invention shown in FIG. 8A was formed on a substrate of cemented carbide in accordance with the procedure of FIG. 5, so that the steps R1 and R2 were repeated to be implemented until the thickness of the diamond coating amounted to a predetermined amount (17 $\mu$m). The conventional diamond coating shown in FIG. 8B was formed on a substrate of cemented carbide, by continuously growing diamond crystals under the crystal growing condition of the step R2 of FIG. 5 until the thickness of the diamond coating amounted to a predetermined amount (16 $\mu$m). It is appreciated from the microphotographs that the surface of the multilayer diamond coating of FIG. 8A consisting of a plurality of layers has smaller pits and projections and is accordingly smoother than the surface of the monolayer diamond coating of FIG. 8B consisting of a single layer. The fact that the surface of the multilayer diamond coating of FIG. 8A is smoother than that of the monolayer diamond coating of FIG. 8B was easily notable even without an electron microscope, in view of their appearances in which the multilayer diamond coating of FIG. 8A was more glossier than the monolayer diamond coating of FIG. 8B.

Figure 9:
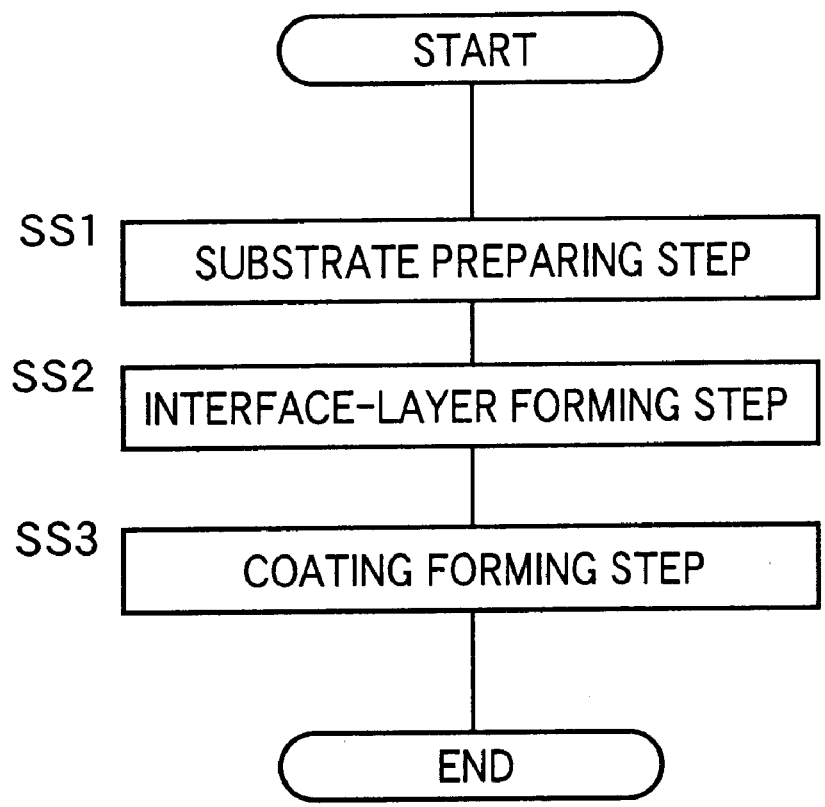
FIG. 9 is a flow chart illustrating a procedure for manufacturing an end mill of another embodiment of the invention, which procedure is different from that of FIG. 2 in that an interface-layer forming step is provided in place of the surface roughening step.

In the above-illustrated embodiment, the tool substrate 12 is subjected to the surface roughening step S2 so that the surface of the tool substrate 12 is roughened for increasing an adhesion strength with which the diamond coating 16 adheres to the tool substrate 12, as shown in FIG. 2. However, the implementation of the surface roughening step S2 may be replaced with the provision of an interface layer between the tool substrate and the diamond coating. FIG. 9 is a flow chart illustrating a procedure for manufacturing a diamond-coated end mill according to another embodiment of the invention. The steps SS1 and SS3 of FIG. 9 are substantially identical with the steps S1 and S3 of FIG. 2, respectively. In the interface-layer forming step SS2, which is implemented in place of the surface roughening step S2 of FIG. 2, the interface layer is disposed on the surface of the cutting tooth portion of the tool substrate. The interface layer may be formed of carbide, nitride or oxide of a metal of groups IVa–VIa in the periodic table, or alternatively of aluminum nitride.

Like in the above-illustrated embodiment, in this embodiment, the diamond coating consists of the plurality of layers formed of the diamond crystals or crystallites each having the diameter and length both of which are equal to or smaller than 1 $\mu$m, so that the outer surface of the diamond coating has a sufficiently high degree of surface smoothness which serves for further improving the surface smoothness of the machined surface of the workpiece.

It is to be understood that the invention may be embodied with various other changes, modifications and improvements, which may occur to those skilled in the art, without departing from the spirit and scope of the invention defined in the following claims.

What is claimed is:

1. A diamond-coated tool comprising:
  a substrate; and
  a diamond coating disposed on said substrate, said diamond coating including a plurality of layers superposed on each other,
  wherein each of said plurality of layers is formed of grown diamond crystals each of which has a diameter not larger than 2 $\mu$m.

2. A diamond-coated tool according to claim 1, wherein said diameter of each of said diamond crystals is not larger than 2 $\mu$m as measured on any one of cross sections perpendicular to a direction in which said each of said diamond crystals has expanded by growth thereof.

3. A diamond-coated tool according to claim 1, wherein said grown diamond crystals consist of grown diamond crystallites.

4. A diamond-coated tool according to claim 1, wherein said diamond-coated tool consists of a rotary cutting tool which is to be rotated about an axis thereof for cutting a workpiece.

5. A diamond-coated tool according to claim 4, wherein said rotary cutting tool consists of an end mill.

6. A diamond-coated tool comprising:

a substrate; and a diamond coating disposed on said substrate, said diamond coating including a plurality of layers superposed on each other, wherein each of said plurality of layers is formed of grown diamond crystals each of which has a length not larger than 2 $\mu$m as measured in a direction in which said each of said diamond crystals has expanded by growth thereof.

7. A diamond-coated tool according to claim 6, wherein said diamond-coated tool consists of a rotary cutting tool which is to be rotated about an axis thereof for cutting a workpiece.

8. A diamond-coated tool according to claim 7, wherein said rotary cutting tool consists of an end mill.

9. A diamond-coated tool comprising:

a substrate having a surface roughened to have a predetermined degree of surface roughness; and a diamond coating consisting of a plurality of layers and disposed on the roughened surface of said substrate, said diamond coating being formed of diamond crystals grown on said substrate, each of said diamond crystals having a diameter not larger than 2 $\mu$m as measured on an outer surface of said diamond coating, said diamond coating having a maximum thickness of not larger than 14 $\mu$m;

wherein said roughened surface has a roughness curve whose maximum height Ry is not larger than 1 $\mu$m and whose ten-point height of irregularities Rz is 0.2–0.5 $\mu$m; and wherein said substrate has a rake face, a flank face and a cutting edge which is defined by an intersection of said rake face and said flank face, said cutting edge being rounded as a result of roughening of said surface of said substrate such that said cutting edge is displaced in an inward direction of said substrate by a distance not larger than 5 $\mu$m.

10. A diamond-coated tool according to claim 9, wherein said diamond-coated tool consists of a rotary cutting tool which is to be rotated about an axis thereof for cutting a workpiece.

11. A diamond-coated tool according to claim 10, wherein said rotary cutting tool consists of an end mill.

12. A method of manufacturing a diamond-coated tool comprising a substrate and a diamond coating disposed on said substrate, said method comprising:

a nucleus bonding step of bonding nucleuses to said substrate which is disposed in a reactor of a chemical vapor deposition device; and a crystal growing step of growing diamond crystals in said reactor in accordance with a chemical vapor deposition method, such that said diamond crystals grow from said nucleuses, wherein said nucleus bonding step and said crystal growing step are repeatedly implemented for thereby forming, on said substrate, said diamond coating including of a plurality of layers superposed on each other, wherein each of said plurality of layers is formed of grown diamond crystals each of which has a diameter not larger then 2 $\mu$m.

13. A method according to claim 12, wherein said diamond crystals are grown for a predetermined time in said crystal growing step, said predetermined time being determined such that each of said diamond crystals grows to have a diameter not larger than 2 $\mu$m as measured on any one of cross sections perpendicular to a direction in which said each of said diamond crystals expands by growth thereof.

14. A method according to claim 12, wherein said diamond crystals are grown for a predetermined time in said crystal growing step, said predetermined time being determined such that each of said diamond crystals grows to have a length not larger than 2 $\mu$m as measured in a direction in which said each of said diamond crystals expands by growth thereof.

15. A method of manufacturing a diamond-coated tool which includes a substrate having a surface, and a diamond coating disposed on said surface of said substrate, said substrate having a rake face, a flank face and a cutting edge that is defined by the an intersection of said rake face and said flank face, said method comprising;

a surface roughening step of roughening said surface of said substrate of said tool, such that the roughened surface has a roughness curve whose maximum height Ry is not larger than 1 $\mu$m and whose ten-point height of irregularities Rz is 0.2–0.5 $\mu$m, and such that said cutting edge is rounded to be displaced in an inward direction of said substrate by a distance not larger than 5 $\mu$m; and a coating forming step of forming said diamond coating on said roughened surface of said substrate, said diamond coating including a plurality of layers by growing diamond crystals in accordance with a chemical vapor deposition method, such that each of said plurality of layers is formed of grown diamond crystals each of which has a diameter not larger than 2 $\mu$m as measured on an outer surface of said diamond coating, and such that said diamond coating consists of a plurality of layers and has a maximum thickness not larger than 14 $\mu$m.

16. A method according to claim 15, wherein said coating forming step includes:

a nucleus bonding step of bonding nucleuses to said substrate which is disposed in a reactor of a chemical vapor deposition device; and a crystal growing step of growing diamond crystals for a predetermined time in said reactor in accordance with a chemical vapor deposition method, such that said diamond crystals grow from said nucleuses, wherein said predetermined time is determined such that each of said diamond crystals grows to have a diameter not larger than 2 $\mu$m, and wherein said nucleus bonding step and said crystal growing step are repeatedly implemented for thereby forming, on said surface of said substrate, said diamond coating consisting of said plurality of layers.

* * * * *